(12) United States Patent
Kwang et al.

(10) Patent No.: US 10,074,599 B2
(45) Date of Patent: Sep. 11, 2018

(54) SEMICONDUCTOR DIES WITH RECESSES, ASSOCIATED LEADFRAMES, AND ASSOCIATED SYSTEMS AND METHODS

(71) Applicant: Micron Technology, Inc., Boise, ID (US)

(72) Inventors: Chua Swee Kwang, Singapore (SG); Yong Poo Chia, Singapore (SG)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 15/620,191

(22) Filed: Jun. 12, 2017

(65) Prior Publication Data

US 2017/0278775 A1  Sep. 28, 2017

Related U.S. Application Data

(63) Continuation of application No. 15/001,070, filed on Jan. 19, 2016, now Pat. No. 9,679,834, which is a
(Continued)

(30) Foreign Application Priority Data

Jul. 24, 2007  (SG) .................................. 200705420

(51) Int. Cl.
*H01L 23/495* (2006.01)
*H01L 23/00* (2006.01)
(Continued)

(52) U.S. Cl.
CPC .... *H01L 23/49575* (2013.01); *H01L 21/4821* (2013.01); *H01L 21/4825* (2013.01);
(Continued)

(58) Field of Classification Search
CPC ......... H01L 23/49575; H01L 23/49503; H01L 23/4951; H01L 21/4825; H01L 21/4821;
(Continued)

(56) References Cited

U.S. PATENT DOCUMENTS

| 4,766,095 | A | 8/1988 | Hiroshi |
| 5,145,099 | A | 9/1992 | Wood et al. |

(Continued)

FOREIGN PATENT DOCUMENTS

| CN | 1753174 | 3/2006 |
| CN | 1845324 | 10/2006 |

(Continued)

OTHER PUBLICATIONS

International Search Report and Written Opinion for International Application No. PCT/US2008/070186, dated Nov. 26, 2008.
(Continued)

*Primary Examiner* — Joseph C Nicely
(74) *Attorney, Agent, or Firm* — Perkins Coie LLP

(57) ABSTRACT

Semiconductor dies with recesses, associated leadframes, and associated systems and methods are disclosed. A semiconductor system in accordance with one embodiment includes a semiconductor die having a first surface and a second surface facing opposite from the first surface, with the first surface having a die recess. The system can further include a support paddle carrying the semiconductor die, with at least part of the support paddle being received in the die recess. In particular embodiments, the support paddle can form a portion of a leadframe. In other particular embodiments, the support paddle can include a paddle surface that faces toward the semiconductor die and has an opening extending through the paddle surface and through the support paddle.

24 Claims, 3 Drawing Sheets

Related U.S. Application Data continuation of application No. 11/861,094, filed on Sep. 25, 2007, now abandoned.

(51) Int. Cl.
*H01L 23/047* (2006.01)
*H01L 21/48* (2006.01)
*H01L 23/31* (2006.01)

(52) U.S. Cl.
CPC ........ *H01L 21/4839* (2013.01); *H01L 23/047* (2013.01); *H01L 23/3114* (2013.01); *H01L 23/4951* (2013.01); *H01L 23/49503* (2013.01); *H01L 24/32* (2013.01); *H01L 24/48* (2013.01); H01L 2224/32145 (2013.01); H01L 2224/32245 (2013.01); H01L 2224/45015 (2013.01); H01L 2224/45099 (2013.01); H01L 2224/48091 (2013.01); H01L 2224/48247 (2013.01); H01L 2224/48464 (2013.01); H01L 2224/73265 (2013.01); H01L 2924/00014 (2013.01); H01L 2924/01006 (2013.01); H01L 2924/01015 (2013.01); H01L 2924/01074 (2013.01); H01L 2924/01079 (2013.01); H01L 2924/01082 (2013.01); H01L 2924/10158 (2013.01); H01L 2924/14 (2013.01); H01L 2924/181 (2013.01); H01L 2924/207 (2013.01)

(58) Field of Classification Search
CPC . H01L 29/0657; H01L 23/3114; H01L 23/047
See application file for complete search history.

(56) References Cited

U.S. PATENT DOCUMENTS

| | | |
|---|---|---|
| 5,674,785 A | 10/1997 | Akram et al. |
| 5,677,566 A | 10/1997 | King et al. |
| 5,804,004 A | 9/1998 | Tuckerman et al. |
| 5,826,628 A | 10/1998 | Hamilton |
| 5,879,965 A | 3/1999 | Jiang et al. |
| 5,986,209 A | 11/1999 | Tandy |
| RE36,469 E | 12/1999 | Wood et al. |
| 6,048,744 A | 4/2000 | Corisis et al. |
| 6,103,547 A | 8/2000 | Corisis et al. |
| 6,130,474 A | 10/2000 | Corisis |
| 6,133,068 A | 10/2000 | Kinsman |
| 6,133,622 A | 10/2000 | Corisis et al. |
| 6,148,509 A | 11/2000 | Schoenfeld et al. |
| 6,150,710 A | 11/2000 | Corisis |
| 6,153,924 A | 11/2000 | Kinsman |
| 6,159,764 A | 12/2000 | Kinsman et al. |
| 6,225,689 B1 | 5/2001 | Moden et al. |
| 6,228,548 B1 | 5/2001 | King et al. |
| 6,229,202 B1 | 5/2001 | Corisis |
| 6,239,489 B1 | 5/2001 | Jiang |
| 6,246,108 B1 | 6/2001 | Corisis et al. |
| 6,246,110 B1 * | 6/2001 | Kinsman ........... H01L 23/49551 257/666 |
| 6,258,623 B1 | 7/2001 | Moden et al. |
| 6,258,624 B1 | 7/2001 | Corisis |
| 6,261,865 B1 | 7/2001 | Akram |
| 6,271,580 B1 | 8/2001 | Corisis |
| 6,284,571 B1 | 9/2001 | Corisis et al. |
| 6,291,894 B1 | 9/2001 | Farnworth et al. |
| 6,297,547 B1 | 10/2001 | Akram |
| 6,303,981 B1 * | 10/2001 | Moden ................ H01L 23/4951 257/666 |
| 6,303,985 B1 | 10/2001 | Larson et al. |
| 6,310,390 B1 | 10/2001 | Moden |
| 6,329,705 B1 * | 12/2001 | Ahmad .................. H01L 23/16 257/666 |
| 6,331,448 B1 | 12/2001 | Ahmad |
| 6,344,976 B1 | 2/2002 | Schoenfeld et al. |
| 6,472,729 B1 | 10/2002 | Oka |
| 6,545,332 B2 | 4/2003 | Huang |
| 6,548,757 B1 | 4/2003 | Russell et al. |
| 6,576,494 B1 | 6/2003 | Farnworth |
| 6,603,072 B1 | 8/2003 | Foster et al. |
| 6,667,543 B1 | 12/2003 | Chow et al. |
| 6,740,870 B1 | 5/2004 | Doudoumopoulos |
| 6,781,243 B1 | 8/2004 | Li et al. |
| 6,882,021 B2 | 4/2005 | Boon et al. |
| 6,969,898 B1 | 11/2005 | Exposito et al. |
| 7,002,241 B1 | 2/2006 | Mostafazadeh et al. |
| 7,064,006 B2 | 6/2006 | Akram |
| 7,074,651 B2 | 7/2006 | Lien |
| 7,132,753 B1 | 11/2006 | St. Amand et al. |
| 7,171,745 B2 | 2/2007 | Mostafazadeh et al. |
| 7,179,740 B1 | 2/2007 | Hsuan |
| 7,218,001 B2 | 5/2007 | Seng |
| 2001/0000631 A1 | 5/2001 | Zandman et al. |
| 2002/0096754 A1 | 7/2002 | Chen et al. |
| 2003/0062606 A1 | 4/2003 | Chun et al. |
| 2003/0071332 A1 | 4/2003 | Hsu et al. |
| 2003/0155693 A1 | 8/2003 | Farnworth et al. |
| 2004/0140546 A1 | 7/2004 | Lee et al. |
| 2004/0207055 A1 | 10/2004 | Iwasa |
| 2004/0245652 A1 | 12/2004 | Ogata |
| 2005/0003583 A1 | 1/2005 | Keating |
| 2005/0230803 A1 | 10/2005 | Liu |
| 2006/0003483 A1 | 1/2006 | Wolff et al. |
| 2006/0049528 A1 | 3/2006 | Kang et al. |
| 2006/0063283 A1 | 3/2006 | Cobbley et al. |
| 2006/0076690 A1 | 4/2006 | Khandros et al. |
| 2006/0087013 A1 | 4/2006 | Hsieh |
| 2006/0175697 A1 | 8/2006 | Kurosawa et al. |
| 2006/0180903 A1 | 8/2006 | Takeda et al. |
| 2006/0226528 A1 | 10/2006 | Kwon |
| 2006/0231937 A1 | 10/2006 | Juskey et al. |
| 2006/0270112 A1 | 11/2006 | Chao et al. |
| 2007/0001708 A1 | 1/2007 | Bertin et al. |
| 2007/0007517 A1 | 1/2007 | Brooks et al. |
| 2007/0011866 A1 | 1/2007 | Lee et al. |
| 2007/0045806 A1 | 3/2007 | Hsuan |
| 2007/0052077 A1 | 3/2007 | Wathanawasam et al. |
| 2007/0059984 A1 | 3/2007 | Farnworth et al. |
| 2007/0085195 A1 | 4/2007 | Lee et al. |
| 2007/0090517 A1 | 4/2007 | Moon et al. |
| 2007/0096266 A1 | 5/2007 | Yu et al. |
| 2007/0096268 A1 | 5/2007 | Sharma et al. |
| 2007/0102803 A1 | 5/2007 | Gann |
| 2007/0126081 A1 | 6/2007 | Webster et al. |
| 2009/0026592 A1 | 1/2009 | Kwang et al. |
| 2011/0215438 A1 | 9/2011 | Kwang et al. |

FOREIGN PATENT DOCUMENTS

| | | | |
|---|---|---|---|
| DE | 202005019706 | 3/2006 | |
| EP | 0669650 | 8/1995 | |
| JP | 61-214565 | 9/1986 | |
| JP | 05251619 | 9/1993 | |
| JP | 05299444 | 11/1993 | |
| JP | 2000012741 | 1/2000 | |
| JP | 2000091490 | 3/2000 | |
| JP | 2000091490 A * | 3/2000 | ............ H01L 24/32 |
| JP | 2006237358 | 9/2006 | |
| JP | 2006-319302 | 11/2006 | |
| KR | 20010055256 | 7/2001 | |
| KR | 2003-0001032 | 1/2003 | |
| KR | 2003-0083445 | 10/2003 | |
| KR | 2004-0031995 | 4/2004 | |
| TW | 236718 | 7/2005 | |
| TW | 248176 | 1/2006 | |
| TW | 251887 | 3/2006 | |
| TW | 254998 | 5/2006 | |
| TW | 260748 | 8/2006 | |
| WO | 2006022591 | 3/2006 | |
| WO | 2006101577 | 9/2006 | |

(56) References Cited

FOREIGN PATENT DOCUMENTS

| WO | 2006124597 | 11/2006 |
|----|------------|---------|
| WO | 2007027399 | 3/2007  |

OTHER PUBLICATIONS

Karnezos, M., "3-D Packaging: Where All Technologies Come Together," Electronics Manufacturing Technology Symposium, 2004, IEEE/CPMT/SEMI 29th International, Jul. 14-16, 2004, pp. 64-67.

Ko, H.S. et al., "Development of Three-Dimensional Memory Die Stack Packages Using Polymer Insulated Sidewall Technique," IEEE Transactions on Advanced Packaging, vol. 23, No. 2, pp. 252-256, May 2000.

Longford, A. et al., "The Use of Pre-Molded Leadframe Cavity Package Technologies in Photonic and RF Applications," pp. 348-352, SEMICON West 2002, SEMI Technology Symposium: International Electronics Manufacturing Technology (IEMT) Symposium, IEEE 2002.

Office Action dated Jun. 21, 2012 in Taiwan Application No. 097128166, 20 pages.

Poh, Francis KS et al., "Development of High Power QFN Package," Electronics Manufacturing Technology Symposium, 2004, IEEE/CPMT/SEMI International, Jul. 14-16, 2004, pp. 295-300.

Robinson, S.D. et al., "Low-Cost Molded Packaging for Optical Data Links," IEEE Transactions on Components, Packaging, and Manufacturing Technology—Part B, vol. 18, No. 2, pp. 235-240, May 1995.

Search Report and Written Opinion dated Dec. 16, 2009 in Singapore Application No. 200705420-8.

Song, S.N., "Die Attach Film Application in Multi Die Stack Package," Proceedings of 7th Electronic Packaging Technology Conference, 2005, vol. 2, pp. 848-852, Dec. 2005.

St. Louis, J. et al., "Low Cost Chip Carriers for the 1980's," IEEE Transactions on Components, Hybrids, and Manufacturing Technology, vol. CHMT-4, No. 2, pp. 205-209, Jun. 1981.

Wu, L. et al., "Innovative Stack-Die Package—S2BGA," Proceedings of 52nd Electronic Components and Technology Conference, IEEE, 2002, pp. 250-253.

* cited by examiner

SEMICONDUCTOR DIES WITH RECESSES, ASSOCIATED LEADFRAMES, AND ASSOCIATED SYSTEMS AND METHODS

CROSS-REFERENCE TO RELATED APPLICATIONS

This application is a continuation of U.S. application Ser. No. 15/001,070 filed Jan. 19, 2016, which is a continuation of U.S. application Ser. No. 11/861,094 filed Sep. 25, 2007, which claims foreign priority benefits of Singapore Application No. 200705420-8 filed Jul. 24, 2007, each of which are incorporated herein by reference in their entireties.

TECHNICAL FIELD

The present disclosure is directed generally to semiconductor dies with recesses, associated leadframes, and associated systems and methods.

BACKGROUND

Semiconductor processing and packaging techniques are continually evolving to meet industry demands for devices with improved performance and reduced size and cost. Electronic products require packaged semiconductor assemblies with a high density of devices in a relatively small space. For example, the space available for memory devices, processors, displays and other semiconductor devices is continually decreasing in cell phones, personal digital assistants, laptop computers and many other products. Accordingly, a need exists to increase the density of semiconductor devices and components within the confined footprint of a semiconductor assembly. One technique for increasing the density of semiconductor devices within a given footprint is to stack semiconductor dies. A challenge with this technique, however, is providing adequate electrical interconnects within and between the stacked dies.

One approach to addressing the challenges associated with stacked semiconductor dies is to use a leadframe having a support paddle that supports the lowest die, and leadfingers that provide electrical connections between the stack of dies and devices external to the finished package. While this arrangement has proven to be suitable for many purposes, the continual pressure to reduce not only the footprint of the package but also the overall volume of the package has created the need for still smaller and more efficiently packaged dies.

DETAILED DESCRIPTION

Several embodiments of the present disclosure are described below with reference to packaged semiconductor devices and assemblies, and methods for forming packaged semiconductor devices and assemblies. Many details of certain embodiments are described below with reference to semiconductor dies. The term "semiconductor die" is used throughout to include a variety of articles of manufacture, including for example, individual integrated circuit dies and/or dies having other semiconductor features. Many specific details of certain embodiments are set forth in FIGS. 1-6 and the following text to provide a thorough understanding of these embodiments. Several other embodiments can have different configurations, components and/or processes than those described in this section. A person skilled in the relevant art, therefore, will appreciate that additional embodiments may be practiced without several details of the embodiments shown in FIGS. 1-6.

Figure 1:
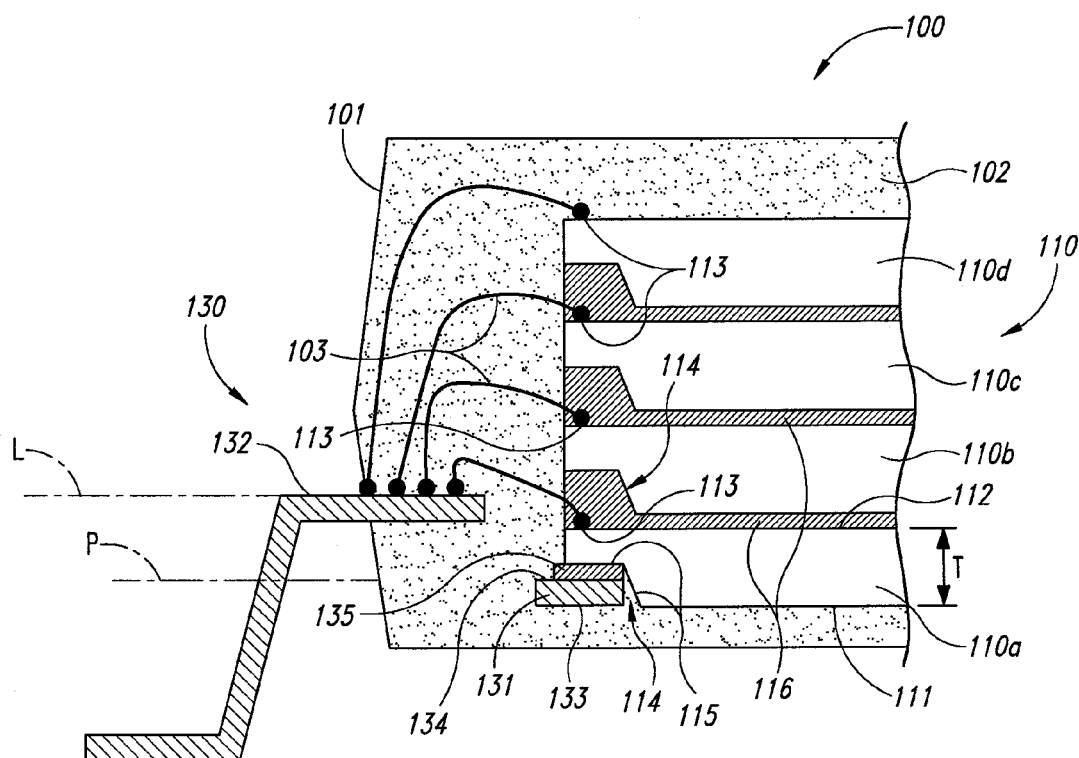
FIG. 1 is a partially schematic, cross-sectional side elevation view of a portion of a package configured in accordance with an embodiment of the disclosure.

FIG. 1 is a partially schematic, cross-sectional view of a system 100 that includes a package 101 (a portion of which is shown) configured in accordance with a particular embodiment. The package 101 can include a leadframe 130 having a support paddle 131 carrying one or more semiconductor dies 110. For purposes of illustration, the leadframe 130 is shown carrying four stacked semiconductor dies 110, shown as first, second, third and fourth semiconductor dies 110a, 110b, 110c, and 110d, respectively. In other embodiments, the leadframe 130 can carry more or fewer dies 110, for example, a single die 110 or two stacked dies 110. In any of these embodiments, the die(s) 110 can include one or more recesses 114 that receive the support paddle 131, as described in further detail below.

In an embodiment shown in FIG. 1, each of the dies 110 has a first (e.g., downwardly facing) die surface 111, and a second (e.g., upwardly facing) second die surface 112. The illustrated first die surface 111 includes two recesses 114, one along each of two opposing edges of the first die surface 111, and one of which is visible in FIG. 1. The recesses 114 can locally reduce a thickness T of the die 110. Suitable techniques for cutting the recesses 114 in the dies 110 are included in U.S. Pat. No. 7,218,001, assigned to the assignee of the present application and incorporated herein by reference. In the arrangement shown in FIG. 1, at least part of the support paddle 131 is received in the recess 114 of the first die 110a. In a particular embodiment, the recess 114 is deep enough so that a first paddle surface 133 (e.g., an outwardly facing surface) is flush with or recessed from the first die surface 111. Accordingly, the addition of the support paddle 131 beneath the first die 110a does not add to the overall thickness T of the first die 110a alone. The support paddle 131 can further include a second paddle surface 134 that faces into the recess 114 and away from the first paddle surface 133. A paddle adhesive 135 can adhesively bond the support paddle 131 to surfaces 115 of the recess 114.

In a particular embodiment, the overall thickness of the first die 110a can be about 120 microns, and the recess 114 can have a depth of about 60 microns. The combined thickness of the support paddle 131 and the paddle adhesive 135 can be about 60 microns or less, so that the first paddle surface 133 is flush with or recessed from the adjacent first die surface 111. In other embodiments, the foregoing features can have different dimensions, while the support paddle 131 still does not add to the overall thickness T of the die 110a and the support paddle 131 combined. In still further embodiments, the support paddle 131 can be only partially received in the recess 114, so that it protrudes, in part, from the recess 114. In such instances, the support paddle 131 does add to the overall thickness of the die 110a and the support paddle 131 combined, but not as much as if the recess 114 were not present.

When the package 101 includes multiple dies 110, the additional dies can be stacked on the first die 110a and attached with corresponding layers of die adhesive 116. The layers of die adhesive 116 can be relatively thin to reduce the overall package thickness and/or the likelihood for thermal conductivity mismatches resulting from differing coefficients of thermal expansion. Each of the dies 110 can include a bond site 113 located proximate to and accessible from the second die surface 112. The bond sites 113 and the recesses 114 of the stacked dies 110 can be arranged so that the recesses 114 of an upper die (e.g., the second die 110b) lie directly over corresponding bond sites 113 of the next lower die (e.g., the first die 110a) in the stack. Accordingly, the recesses 114 of the upper dies can house, accommodate and/or receive electrical connections between the leadframe 130 and the bond sites 113 of the lower die.

To support electrical connections to the semiconductor dies 110, the leadframe 130 includes leadfingers 132 that extend inwardly toward the dies 110. Individual leadfingers 132 can be connected to corresponding bond sites 113 of the dies 110 with wire bonds 103. When the package 101 includes multiple dies 110, an individual leadfinger 132 may be connected to corresponding bond sites 113 of each of the dies 110. The recesses 114 can reduce or eliminate the likelihood for the wire bonds 103 to contact the semiconductor die 110 in which the recesses 114 are formed.

Multiple leadfingers 132 may be arranged side by side in a direction extending transverse to the plane of FIG. 1, and may accordingly form a leadfinger plane L, an edge of which is visible in FIG. 1. The support paddle or paddles 131 may extend in a direction generally transverse to the plane of FIG. 1 and may accordingly form a paddle plane P. In a particular embodiment, the leadfinger plane L is offset from the paddle plane P in a direction generally aligned with the thickness dimension T of the dies 110. This arrangement can reduce the length of the wire bond 103 required to connect the leadfinger 132 to the furthest die (e.g., the fourth die 110d). In other embodiments, the leadfinger plane L and the paddle plane P can have arrangements other than that shown in FIG. 1. For example, when the package 101 includes only the first die 110a, the leadfinger plane L may be coplanar with the paddle plane P. In any of these arrangements, once the electrical connections between the leadframe 130 and the die(s) 110 are formed, the die(s) 110, the wire bonds 103, the support paddle 131, and the leadfingers 132 can be at least partially encapsulated with an encapsulant 102. Portions of the leadfingers 132 that project outwardly from the encapsulant 102 can then be trimmed, shaped, and/or otherwise formed to provide connections to external components.

Figure 2:
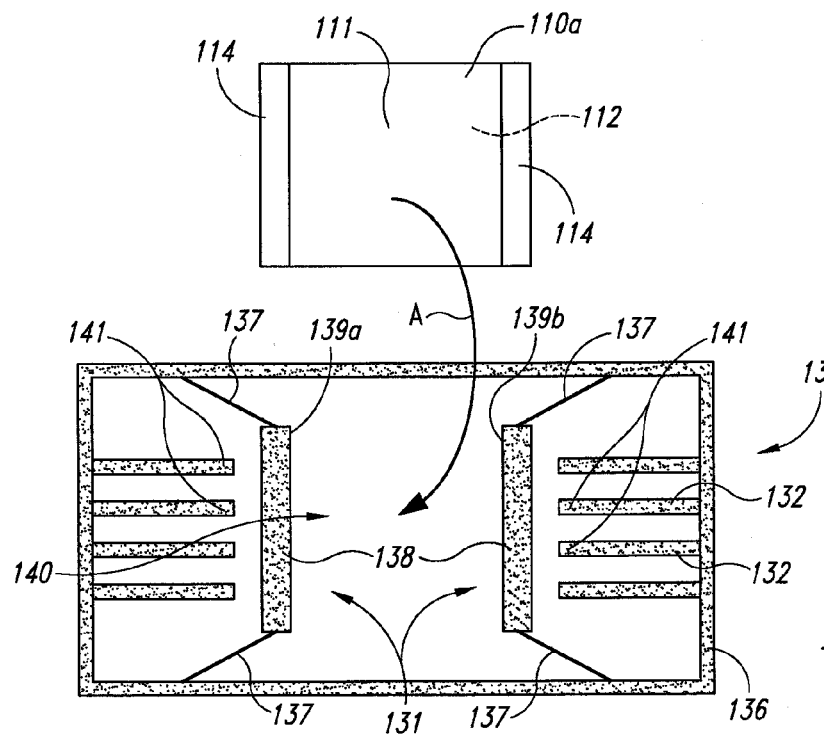
FIG. 2 is a partially schematic, exploded plan view illustration of package components, including a semiconductor die and a leadframe having leadfingers and a support paddle configured in accordance with an embodiment of the disclosure.

FIG. 2 is a partially exploded, schematic plan view illustration of components of an embodiment of the package 101, including the leadframe 130 and the first die 110a shown in FIG. 1. The leadframe 130 can be formed from a unitary thin sheet of conductive material (e.g., gold), using a stamping process or another suitable process. The leadframe 130 includes a frame member 136, which temporarily carries the inwardly extending leadfingers 132 and the support paddle 131. The support paddle 131 is positioned inwardly from the leadfingers 132 and is supported relative to the frame member 136 by removable ties 137. In this particular embodiment, the support paddle 131 includes a paddle surface 138 that is divided over a first portion 139a and second portion 139b. Accordingly, the paddle surface 138 is discontinuous in this embodiment. When the first semiconductor die 110a is inverted and positioned face down on top of the frame member 136 (as indicated by arrow A), each of the recesses 114 is aligned with and receives a corresponding one of the first and second portions 139a, 139b. The bond sites 113 (FIG. 1) on the second die surface 112 are then electrically connected to the leadfingers 132 at corresponding leadfinger bond sites 141 e.g., using standard wire bonds, or other suitable conductive couplers. If further dies are to be stacked on the first die 110a, each one is stacked and connected to the leadfingers 132 before the next die is stacked and electrically connected to the leadframe 130. After all the dies have been stacked and electrically connected to the leadframe 130, the assembly is placed in a mold and encapsulated, after which the frame member 136, the ties 137 and (optionally) portions of the leadfingers 132 are removed.

In a particular embodiment of the arrangement shown in FIG. 2, the leadframe 130 includes an opening 140 between the first and second portions 139a, 139b. The first and second portions 139a, 139b can be elongated so as to fit into the corresponding elongated recesses 114 of the first semiconductor die 110a. Because the first die 110a is rectangular and the recesses 114 are aligned with opposing edges of the first semiconductor die 110a, the first and second portions 139a, 139b of the support paddle 131 can also be aligned generally parallel to each other. In other embodiments, the leadframe 130 can have other arrangements that also support one or more semiconductor dies 110. Representative arrangements are described below with reference to FIGS. 3 and 4.

Figure 3:
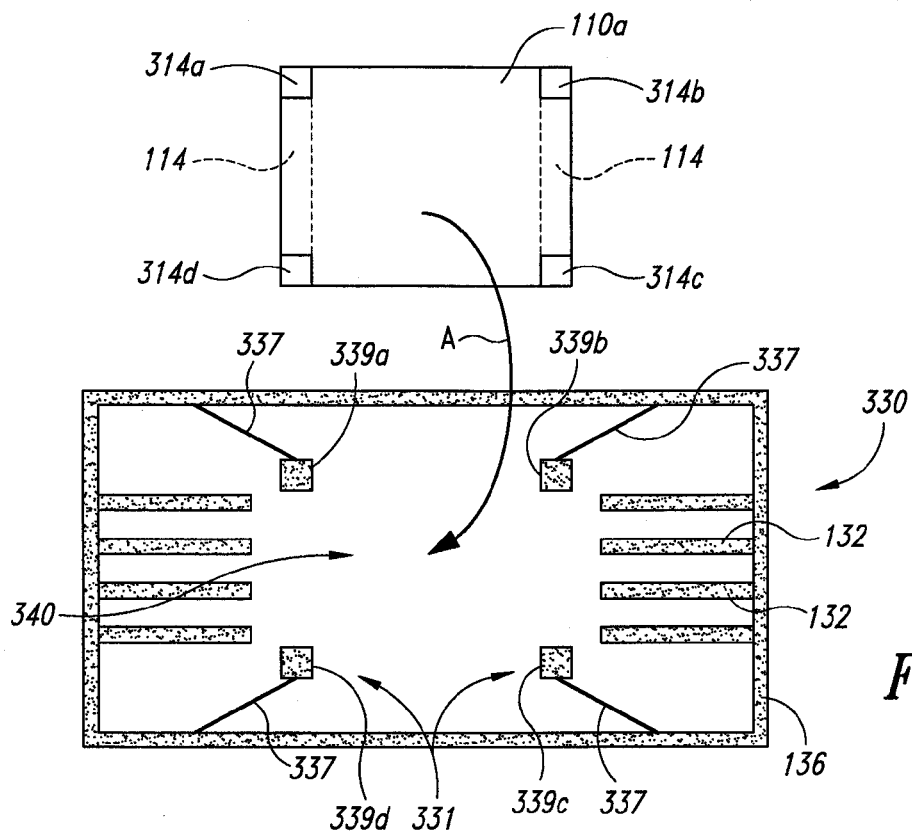
FIG. 3 is a partially schematic, exploded plan view illustration of a semiconductor die and a leadframe having a support paddle configured in accordance with an embodiment of the disclosure.

Beginning with FIG. 3, a leadframe 330 in accordance with another embodiment includes a frame member 136 and leadfingers 132 arranged generally similarly to the corresponding components described above with reference to FIG. 2. The leadframe 330 further includes a support paddle 331 having four spaced apart portions 339 (shown as first, second, third and fourth portions 339a, 339b, 339c, and 339d, respectively) positioned around a central opening 340. Each of the portions 339a can be connected to the frame member 136 with a corresponding tie 337. The first semiconductor die 110a can include elongated recesses 114 (shown in dashed lines) generally similar to those shown in FIG. 2 so as to accommodate and receive the portions 339a-339d of the support paddle 331. In another embodiment, the first semiconductor die 110a can instead include four separate recesses 314a-314d, each positioned at a corner of the first die 110a to receive a corresponding one of the support paddle portions 339a-339d. The support paddle portions 339a-339d can be arranged symmetrically, e.g., so that a diagonal line connecting the first and third portions 339a, 339c bisects a diagonal line connecting the second and fourth portions 339b, 339d. In other embodiments, the paddle portions 339 can have other symmetric or asymmetric arrangements.

Figure 4:
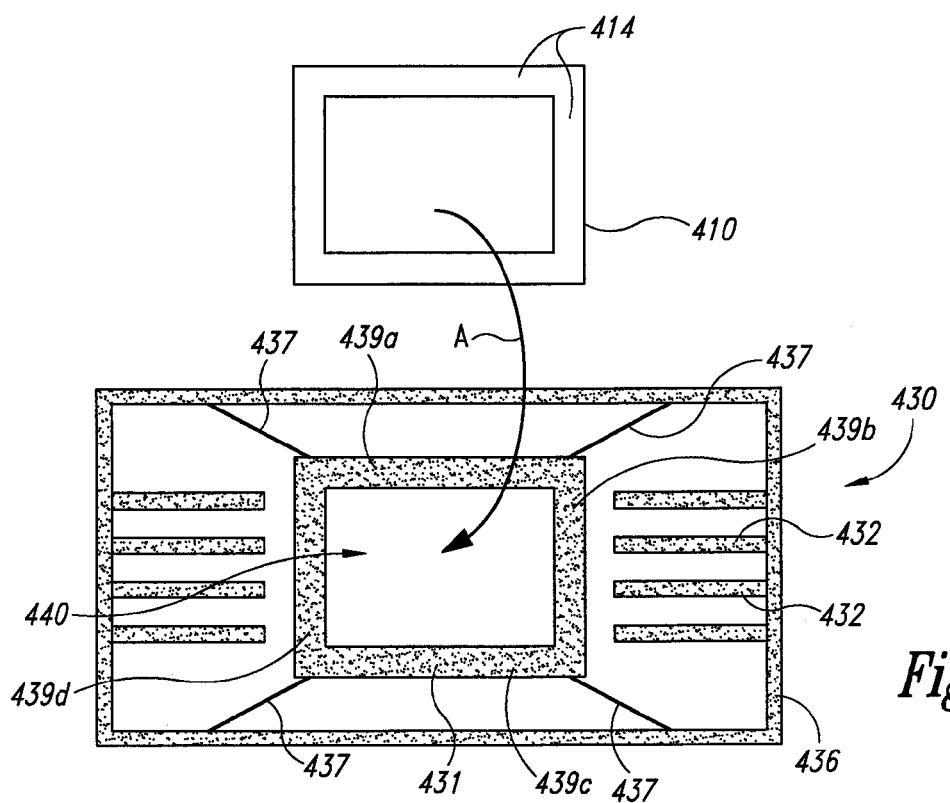
FIG. 4 is a partially schematic, exploded plan view illustration of a semiconductor die and a leadframe having a support paddle configured in accordance with an embodiment of the disclosure.

FIG. 4 illustrates a leadframe 430 that carries a corresponding semiconductor die 410 in accordance with another embodiment. The leadframe 430 can include a frame member 436 that carries inwardly extending leadfingers 432 and a unitary support paddle 431. The support paddle 431 can have a central opening 440, and can be temporarily supported relative to the frame member 436 with ties 437. Accordingly, the support paddle 431 can have a shape generally similar to a picture frame, and in a particular embodiment, can have four portions 439a-439d that are integrally connected to form a unitary structure. The corresponding semiconductor die 410 includes a corresponding recess 414 positioned around its periphery to mirror the arrangement of the support paddle 431. Accordingly, when the semiconductor die 410 is inverted and placed on the leadframe 430, the generally frame-shaped support paddle 431 is received in the generally framed-shaped recess 414 of the semiconductor die 410, and the central portion of the semiconductor die 410 is received in the central opening 440 of the leadframe 430.

Figure 5:
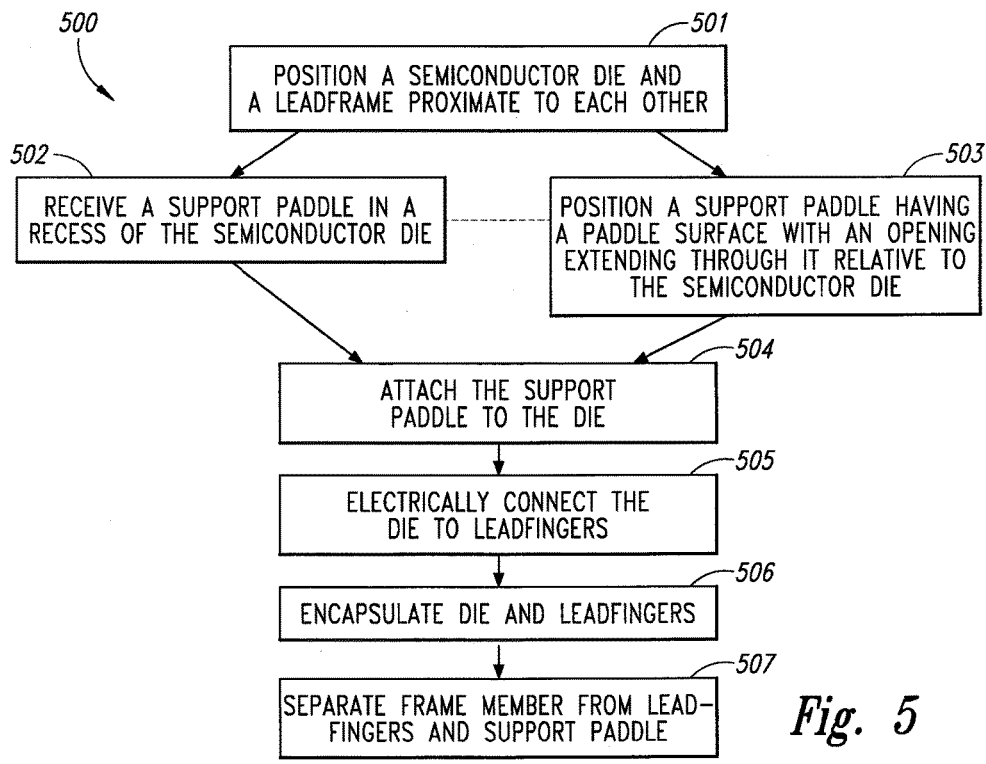
FIG. 5 is a flow diagram illustrating methods for packaging semiconductor dies in accordance with several embodiments of the disclosure.
Figure 6:
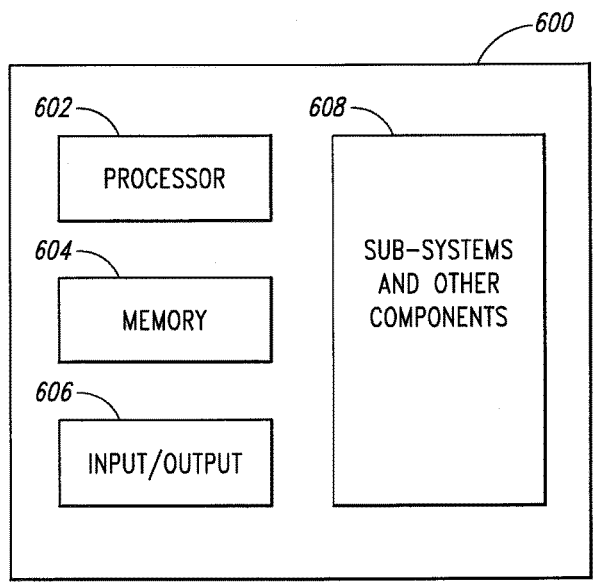
FIG. 6 is a partially schematic, block diagram illustrating a system in which packages may be incorporated in accordance with still further embodiments of the disclosure.

FIG. 5 is a flow diagram of a process 500 for forming packaged semiconductor devices in accordance with several embodiments. For purposes of illustration, features of several embodiments are shown together in FIG. 5. It will be understood by one of ordinary skill in the relevant art that further particular embodiments may be practiced with fewer than all the steps identified in FIG. 5, and that in other embodiments, additional steps may be performed in addition to those identified in FIG. 5.

Process portion 501 includes positioning a semiconductor die and a leadframe proximate to each other. In process portion 502, a support paddle is received in a recess of the semiconductor die. For example, a support paddle or support paddle portion having any of the configurations described above with reference to FIGS. 1-4 be can be received in one or more corresponding recesses of a semiconductor die.

Process portion 503 includes positioning a support paddle (having a paddle surface with an opening extending through it) relative to the semiconductor die. Process portion 503 can be performed in addition to or in lieu of process portion 502. For example, in the context of the arrangements describe above with reference to FIGS. 1-4, the opening in the support paddle can allow the support paddle to be positioned so that the paddle surface is received or partially received in one or more recesses of the die. However, in other embodiments, a paddle having an opening extending through it can support a semiconductor die without necessarily having the support surfaces received in a recess of the die.

In any of the foregoing embodiments, the support paddle can be attached to the die (process portion 504), and the die can be electrically connected to leadfingers (process portion 505). In process portion 506, the die, the leadfingers, and/or the support paddle can be encapsulated to protect these components. In process portion 507, a frame member, which may temporarily support the leadfingers and the support paddle relative to the die, can be removed, typically after the encapsulation process has been completed.

One feature of semiconductor packages configured and/or manufactured in accordance with at least some of the foregoing embodiments described above with reference to FIGS. 1-5 is that they include support paddles received in one or more recesses of a corresponding semiconductor die. This arrangement can reduce the overall thickness of the semiconductor package because the thickness of the support paddle is not cumulative to the thickness of the semiconductor die. Instead, the support paddle can be fully or partially recessed into the adjacent surface of the die. The presence of the recesses in the die can allow the overall thickness of the die to remain relatively high (e.g., above 100 microns) without adding to the overall thickness of the combined die/support paddle. Dies having a thickness in the foregoing range can have good refresh margins and/or read/write speeds, without compromising on the compact (e.g., thin) profile of the packaged dies. In further particular embodiments, the support paddles can form part of an overall leadframe that also includes leadfingers for electrical connections to the semiconductor die. Accordingly, the leadframe can provide both the low-profile support described above, and electrical connections with external devices.

Another feature of at least some of the foregoing embodiments is that the support paddle can include multiple paddle surfaces separated by an opening. As a result, the amount of material required to form the support paddle can be reduced when compared to a conventional paddle that has a solid geometry generally mirroring the footprint of the die that it supports. Reducing the amount of material for the support paddle can reduce the cost of the paddle and therefore the cost of the completed package. Despite the reduction in the size of the support paddle 131, the combination of the support paddle 131, the ties 137 and the leadframe 130 provide adequate support to the semiconductor die or dies they carry during the wire bond and encapsulation steps Any of the semiconductor packages described above with reference to FIGS. 1-5 can be incorporated into any of a myriad of larger and/or more complex systems, a representative example of which is a system 600 shown schematically in FIG. 6. The system 600 can include a processor 602, a memory 604 (e.g., SRAM, DRAM, flash memory and/or other memory device), input/output devices 606 and/or other subsystems or components 608. Semiconductor packages having any one or a combination of the features described above with reference to FIGS. 1-5 may be included in any of the components shown in FIG. 6. The resulting system 600 can perform any of a wide variety of computing, processing, storage, sensing, imaging and/or other functions. Accordingly, the representative system 600 includes, without limitation, computers and/or other data processors, for example, desktop computers, laptop computers, Internet appliances, hand-held devices (e.g., palm-top computers, wearable computers, cellular or mobile phones, personal digital assistants, music players, etc.), multi-processor systems, processor-based or programmable consumer electronics, network computers and mini computers. Other representative systems 600 may be housed in a single unit or distributed over multiple interconnected units (e.g., through a communication network). The components of the system 600 can accordingly include local and/or remote memory storage devices, and any of a wide variety of computer readable media.

From the foregoing, it will be appreciated that specific embodiments have been described herein for purpose of illustration, but that the foregoing systems and methods may have other embodiments as well. For example, while the leadfingers and support paddles were described above in the context of a generally uniform and continuous leadframe, and accordingly have similar or identical material properties, in other embodiments, the leadfingers and the paddle supports can have different compositions, and/or non-unitary arrangements. The support paddles can have shapes and/or arrangements other than those specifically described above, for example, opposing "C" shaped support portions, more than four support portions, and/or others. The support paddle can be secured to the die with arrangements other than those shown in the Figures, e.g., a thin film that extends over both the support paddle and the adjacent (flush or semi-flush) die surface.

Certain features described in the context of particular embodiments may be combined or eliminated in other embodiments. For example, several of the embodiments described above were described in the context of paddle supports received in recesses of corresponding semiconductor dies, but in other embodiments, the paddle supports can include multiple spaced apart portions, or openings between paddle support portions, without necessarily being received in recesses of corresponding semiconductor dies. In another example, the semiconductor die shown in FIG. 4 can be used with the support paddles shown in FIGS. 1-3. Further, while certain advantages may be associated with certain embodiments, other embodiments may also exhibit such advantages, and not all embodiments need necessarily exhibit such advantages. Accordingly, the disclosure can include other embodiments not shown or described above.

We claim:

1. A semiconductor package, comprising:
a semiconductor die including a first surface and a second surface facing opposite from the first surface, the first surface having a first die recess along a first edge of the semiconductor die and a second die recess along a second edge of the semiconductor die;
a support paddle including a first support paddle portion with a first thickness less than or equal to a first depth of the first die recess and at least partially disposed in the first die recess, and a second support paddle portion with a second thickness less than or equal to a second depth of the second die recess and at least partially disposed in the second die recess;
a leadframe including a frame member and a plurality of leadfingers connected to and extending inwardly from the frame member, each of the plurality of leadfingers having a leadfinger bond site;
a first removable tie connecting the first support paddle portion to the leadframe;
a second removable tie connecting the second support paddle portion to the leadframe;
a plurality of wire bonds electrically coupling corresponding ones of the plurality of leadfinger bond sites and a plurality of bond pad sites on the semiconductor die; and
an encapsulant disposed around at least a portion of the first removable tie.

2. The semiconductor package of claim 1 wherein the first and second support paddle portions are elongated along generally parallel axes.

3. The semiconductor package of claim 1 wherein the plurality of bond pad sites are on the second surface of the semiconductor die.

4. The semiconductor package of claim 1 wherein the semiconductor die is a first semiconductor die, and further comprising a second semiconductor die stacked over the first semiconductor die.

5. The semiconductor package of claim 4 wherein the second semiconductor die includes a plurality of die recesses through which the plurality of wire bonds extend.

6. The semiconductor package of claim 5 wherein the second semiconductor die includes a second plurality of bond pad sites and further comprising a second plurality of wire bonds electrically coupling corresponding ones of the plurality of leadfinger bond sites and the second plurality of bond pad sites.

7. The semiconductor package of claim 6 wherein the second plurality of bond pad sites are on a surface of the second semiconductor die opposite the plurality of die recesses.

8. The semiconductor package of claim 1, wherein the encapsulant is disposed around at least a portion of the semiconductor die and at least a portion of the support paddle.

9. A semiconductor package, comprising:
a semiconductor die including a first surface and a second surface facing opposite from the first surface, the first surface having a contiguous die recess adjacent a periphery of the semiconductor die;
a support paddle including a frame-shaped portion with a thickness less than or equal to a depth of the contiguous die recess and at least partially disposed in the contiguous die recess, the frame-shaped portion extending along at least most of an entire length of the periphery of the first semiconductor die;
a leadframe including a frame member and a plurality of leadfingers connected to and extending inwardly from the frame member, each of the plurality of leadfingers having a leadfinger bond site; and
a plurality of wire bonds electrically coupling corresponding ones of the plurality of leadfinger bond sites and a plurality of bond pad sites on the semiconductor die.

10. The semiconductor package of claim 9 wherein the plurality of bond pad sites are on the second surface of the semiconductor die.

11. The semiconductor package of claim 9 wherein the semiconductor die is a first semiconductor die, and further comprising a second semiconductor die stacked over the first semiconductor die.

12. The semiconductor package of claim 11 wherein the second semiconductor die includes a second contiguous die recess adjacent a periphery of the second semiconductor die through which the plurality of wire bonds extend.

13. The semiconductor package of claim 12 wherein the second semiconductor die includes a second plurality of bond pad sites and further comprising a second plurality of wire bonds electrically coupling corresponding ones of the plurality of leadfinger bond sites and the second plurality of bond pad sites.

14. The semiconductor package of claim 13 wherein the second plurality of bond pad sites are on a surface of the second semiconductor die opposite the contiguous die recess.

15. The semiconductor package of claim 9, further comprising an encapsulant disposed around at least a portion of the semiconductor die and at least a portion of the support paddle.

16. The semiconductor package of claim 9 wherein the frame-shaped portion includes
a first paddle portion extending along a first edge of the semiconductor die,
a second paddle portion extending along a second edge of the semiconductor die, the first and second portions are elongated along substantially parallel axes,
a third paddle portion extending between the first paddle portion and the second paddle portion and along a third edge of the semiconductor die, and
a fourth paddle portion extending between the first paddle portion and the second paddle portion and along a fourth edge of the semiconductor die.

17. The semiconductor package of claim 9, further comprising an elongate tie connecting the support paddle to the leadframe.

18. A semiconductor package, comprising:
a first semiconductor die including a first surface and a second surface facing opposite from the first surface, the first surface having a first contiguous die recess adjacent a periphery of the first semiconductor die;

a support paddle including a frame-shaped portion with a thickness less than or equal to a depth of the contiguous die recess and at least partially disposed in the first contiguous die recess;

a leadframe including a frame member and a plurality of leadfingers connected to and extending inwardly from the frame member, each of the plurality of leadfingers having a leadfinger bond site;

a first plurality of wire bonds electrically coupling corresponding ones of the plurality of leadfinger bond sites and a first plurality of bond pad sites on the first semiconductor die;

an elongate tie connected to and extending between the support paddle and the leadframe;

a second semiconductor die including a third surface and a fourth surface facing opposite from the third surface, the third surface having a second contiguous die recess adjacent a periphery of the second semiconductor die, wherein the first plurality of wire bonds extend through the second contiguous die recess;

a second plurality of wire bonds electrically coupling corresponding ones of the plurality of leadfinger bond sites and a second plurality of bond pad sites on the second semiconductor die; and an encapsulant disposed around at least a portion of the elongate tie.

19. The semiconductor package of claim 18 wherein the first plurality of bond pad sites are on the second surface of the first semiconductor die.

20. The semiconductor package of claim 18 wherein the second plurality of bond pad sites are on the fourth surface of the second semiconductor die.

21. The semiconductor package of claim 18, wherein the encapsulant is disposed around at least a portion of the first and second semiconductor dies and at least a portion of the support paddle.

22. The semiconductor package of claim 18 wherein the elongate tie is a first removable elongate tie, and further including a second removable elongate tie connected to and extending between the support paddle and the leadframe.

23. The semiconductor package of claim 18, wherein the encapsulant is disposed around at least a portion of the first semiconductor die, at least a portion of the second semiconductor die, and at least a portion of the support paddle.

24. The semiconductor package of claim 18 wherein the support paddle is disposed along an entire periphery of the first semiconductor die.

* * * * *